US008104693B2

(12) United States Patent
Ono

(10) Patent No.: US 8,104,693 B2
(45) Date of Patent: Jan. 31, 2012

(54) MULTILAYER PIEZOELECTRIC ELEMENT, INJECTION DEVICE AND FUEL INJECTION SYSTEM USING THE SAME, AND METHOD OF MANUFACTURING MULTILAYER PIEZOELECTRIC ELEMENT

(75) Inventor: Susumu Ono, Kirishima (JP)

(73) Assignee: Kyocera Corporation, Kyoto (JP)

( * ) Notice: Subject to any disclaimer, the term of this patent is extended or adjusted under 35 U.S.C. 154(b) by 222 days.

(21) Appl. No.: 12/443,450

(22) PCT Filed: Sep. 26, 2007

(86) PCT No.: PCT/JP2007/068719

§ 371 (c)(1),
(2), (4) Date: Mar. 27, 2009

(87) PCT Pub. No.: WO2008/038683

PCT Pub. Date: Apr. 3, 2008

(65) Prior Publication Data

US 2010/0072306 A1 Mar. 25, 2010

(30) Foreign Application Priority Data

Sep. 28, 2006 (JP) ................................ 2006-264012
Dec. 15, 2006 (JP) ................................ 2006-338637

(51) Int. Cl.
*B05B 1/08* (2006.01)

(52) U.S. Cl. ................................ 239/102.2; 239/102.1

(58) Field of Classification Search .............. 239/102.1, 239/102.2, 585.1–585.5, 533.2; 347/54
See application file for complete search history.

(56) References Cited

U.S. PATENT DOCUMENTS 7,309,945 B2 12/2007 Iwase et al.
7,416,281 B2 * 8/2008 Nishimura et al. ............ 347/54
2005/0168106 A1 8/2005 Iwase et al.
2007/0001031 A1 * 1/2007 Sasaki ....................... 239/533.2
2007/0269667 A1 11/2007 Kobayashi et al.

FOREIGN PATENT DOCUMENTS

JP 08242023 A 9/1996
JP 08274381 A 10/1996
JP 2001102646 A 4/2001
JP 2005108989 A 4/2005
JP 2005223013 A 8/2005
WO 2006087871 A1 8/2006

OTHER PUBLICATIONS

International Search Report for corresponding PCT application PCT/JP2007/068719.

* cited by examiner

*Primary Examiner* — Davis Hwu
(74) *Attorney, Agent, or Firm* — DLA Piper LLP (US)

(57) ABSTRACT

A multilayer piezoelectric element is provided which has excellent durability even if it is continuously driven for a long period of time under high temperature and high humidity. The multilayer piezoelectric element has a laminated body that a plurality of piezoelectric layers are laminated through an internal electrode interposed therebetween, in which the internal electrode, a dummy electrode spaced apart and electrically insulated from the internal electrode, and an insulating part between the dummy electrode and the internal electrode are arranged between two adjacent piezoelectric layers. A porous part having a larger number of voids than the internal electrode is formed at positions opposed in the laminating direction to the internal electrode, the dummy electrode and the insulating part through the piezoelectric layer interposed therebetween, respectively.

20 Claims, 13 Drawing Sheets

10
A A
13
11
17
19
17
6

(a)

(b)

(c)

MULTILAYER PIEZOELECTRIC ELEMENT, INJECTION DEVICE AND FUEL INJECTION SYSTEM USING THE SAME, AND METHOD OF MANUFACTURING MULTILAYER PIEZOELECTRIC ELEMENT

CROSS-REFERENCE TO THE RELATED APPLICATIONS

This application is a national stage of international application No. PCT/JP2007/068719 filed Sep. 26, 2007, which also claims the benefit of priority under 35 USC 119 to Japanese Patent Application No. 2006-264012 filed Sep. 28, 2006 and Japanese Patent Application No. 2006-338637 filed Dec. 15, 2006, the entire contents of which are incorporated herein by reference.

TECHNICAL FIELD

The present invention relates to a multilayer piezoelectric element, an injection device and a method of manufacturing the multilayer piezoelectric element.

BACKGROUND ART

There has conventionally been known a multilayer piezoelectric element having a laminated body that a plurality of piezoelectric layers are laminated through an internal electrode interposed therebetween, and having a pair of external electrodes formed on the side surface of the laminated body. Generally, in the multilayer piezoelectric element (in some cases hereinafter referred to simply as an "element"), the internal electrode is not formed over the entire main surface of the piezoelectric layer, thereby having a so-called partial electrode structure. The internal electrodes of the partial electrode structure are alternately exposed at opposite side surfaces of the laminated body, and alternately connected to a pair of external electrodes.

In the element thus having the partial electrode structure, the region where the internal electrode is printed, and the region where no internal electrode is printed differ from each other in the shrinkage percentages during sintering. Therefore, after sintering, residual stress is induced in the element. In order to decrease the residual stress, for example, Patent document 1 and Patent document 2 have proposed to decrease the residual stress by forming a shrinkage percentage adjustment layer (a dummy electrode) at the region where no internal electrode is printed.

Patent document 1: Japanese Unexamined Patent Publication No. 8-242023

Patent document 2: Japanese Unexamined Patent Publication No. 2001-102646

DISCLOSURE OF INVENTION

Technical Problem

Recently, it has been needed to ensure a large amount of displacement and enable a long-term continuous driving under high temperature and high humidity environment. Consequently, attempts are being made to achieve a large amount of displacement and a long-term continuous driving by applying a high electric field to the element. When the long-term continuous driving is carried out under the high temperature, high humidity, high electric field and high voltage conditions, the effect of reducing the occurrence of cracks has been not sufficient by merely forming the dummy electrode as in the elements described in the Patent documents 1 and 2.

Technical Solution

The present inventor made research effort to solve the above problem and focused on the fact that in the multilayer piezoelectric element provided with an internal electrode, a dummy electrode spaced apart and electrically insulated from the internal electrode, and an insulating part interposed between the dummy electrode and the internal electrode, a piezoelectric layer connected to the internal electrode and the dummy electrode composed of metal, and a piezoelectric layer connected to the insulating part interposed therebetween differ from each other in sintering behavior during sintering. Therefore, the difference in the sintering behavior contributes to a cause of the residual stress of the element. Then, the present inventor has completed the present invention based on the following new fact that the residual stress of the element can be decreased, and the stress exerted on the element during driving can also be relaxed by forming a porous part having more voids than the internal electrode at a position opposed in the laminating direction to the insulating part through the piezoelectric layer interposed therebetween.

Specifically, the multilayer piezoelectric element of the invention has a laminated body that a plurality of piezoelectric layers are laminated through an internal electrode interposed therebetween, in which the internal electrode, a dummy electrode spaced apart and electrically insulated from the internal electrode, and an insulating part between the dummy electrode and the internal electrode are arranged side by side between the piezoelectric layers adjacent to each other in a laminating direction. A porous part having more voids than the internal electrode is formed at a position opposed in the laminating direction to the insulating part through the piezoelectric layer interposed therebetween.

Preferably, the porous part is formed at positions opposed in the laminating direction to the internal electrode, the dummy electrode and the insulating part through the piezoelectric layer interposed therebetween, respectively.

Preferably, the porous part is formed at positions opposed on both sides in the laminating direction to the insulating part through the piezoelectric layer interposed therebetween, respectively.

Preferably, the laminated body has on the side surface thereof a pair of external electrodes, and the dummy electrode is electrically connected to an external electrode different from the external electrode, to which the internal electrode existing between the same piezoelectric layers as the dummy electrode, is electrically connected.

Alternatively, the laminated body may have on the side surface thereof a pair of external electrodes, and the dummy electrode may be electrically insulated from the external electrodes.

Other multilayer piezoelectric element of the invention has a laminated body that a plurality of piezoelectric layers are laminated through an internal electrode interposed therebetween. The laminated body has, between internal electrodes adjacent to each other in the laminating direction of the laminated body, a porous part having more voids than these internal electrodes, and has, between the porous part and at least one of the internal electrodes adjacent to each other, a dummy electrode spaced apart and electrically insulated from these internal electrodes.

Preferably, the dummy electrode comprises a plurality of dummy parts spaced apart and electrically insulated from one another.

Preferably, the porous part has at least one of metal parts composed of metal and ceramic parts composed of ceramics, existing between two adjacent piezoelectric layers through a void interposed therebetween, respectively.

Preferably, a plurality of the metal parts are spaced apart and electrically insulated from one another.

Preferably, the laminated body is provided with a plurality of the porous parts, and these porous parts are arranged regularly in the laminating direction of the laminated body.

Preferably, the internal electrodes, adjacent to each other on both sides in the laminating direction with respect to the porous parts through the piezoelectric layer interposed therebetween, respectively, have the same polarity. Alternatively, the internal electrodes, adjacent to each other on both sides in the laminating direction with respect to the porous parts through the piezoelectric layer interposed therebetween, respectively, may have different polarities.

The injection device of the invention is provided with a container having an injection hole and the multilayer piezoelectric element set forth above. The liquid filled in the container is delivered from the injection hole by the driving of the multilayer piezoelectric element.

The fuel injection system of the invention is provided with a common rail to store high-pressure fuel, the above injection device to inject the fuel stored in the common rail, a pressure pump to supply high-pressure fuel to the common rail, and an injection control unit to supply drive signals to the injection device.

The method of manufacturing a multilayer piezoelectric element of the invention is for manufacturing a multilayer piezoelectric element having a laminated body that a plurality of piezoelectric layers are laminated through an internal electrode interposed therebetween, in which the internal electrode, a dummy electrode spaced apart and electrically insulated from the internal electrode, and an insulating part between the dummy electrode and the internal electrode are arranged between two adjacent piezoelectric layers. The method includes the step of forming, on a surface of a ceramic green sheet, an internal electrode paste layer containing a metal composition $M_1$, and forming a dummy electrode paste layer containing a metal composition $M_1$ while leaving a spaced part from the internal electrode paste layer in order to form an insulating part, the step of forming a stress relaxation paste layer containing a metal composition $M_1$ at a position corresponding to the spaced part on a surface of other ceramic green sheet, the step of forming a molded laminated body including a portion in which these ceramic green sheets are laminated adjacently, and the step of sintering the molded laminated body. The stress relaxation paste layer has a higher ratio X of the metal composition $M_1$ to the total amount of the metal composition in the paste than the internal electrode paste layer and the dummy electrode paste layer.

Preferably, the stress relaxation paste layer is formed at positions corresponding to the internal electrode paste layer, the dummy electrode paste layer and the spaced part therefrom, respectively.

Advantageous Effects

In the multilayer piezoelectric element of the invention, the porous part having more voids than the internal electrode is formed at the position opposed in the laminating direction to the insulating part through the piezoelectric layer interposed therebetween. Therefore, even if residual stress is induced by the difference of sintering behavior between the piezoelectric layer connected to the internal electrode and the dummy electrode, and the piezoelectric layer connected to the insulating part where neither the internal electrode nor the dummy electrode is formed, the porous part can absorb the residual stress. This enables reduction of cracks caused by the residual stress, thereby providing the multilayer piezoelectric element having excellent durability even if it is driven under high temperature, high humidity and high electric field conditions.

When the porous part is formed at positions opposed in the laminating direction to the internal electrode, the dummy electrode and the insulating part through the piezoelectric layer interposed therebetween, respectively, stress relaxation effect can be further enhanced.

When the porous part is formed at positions on both sides in the laminating direction to the insulating part through the piezoelectric layer interposed therebetween, respectively, the residual stress during sintering can be further decreased to further enhance the reliability of the element.

When the laminated body has on the side surfaces thereof a pair of external electrodes, and the dummy electrode is electrically connected to an external electrode different from the external electrode, to which the internal electrode existing between the same piezoelectric layers as the dummy electrode, is electrically connected, a voltage is applied to the piezoelectric layer existing between the internal electrode and the dummy electrode in between the piezoelectric layers, and this piezoelectric layer will cause unnecessary displacement. However, the stress due to this unnecessary displacement can be absorbed by the porous part. Thereby, the stress induced in the vicinity of the piezoelectric layer existing between the internal electrode and the dummy electrode can be relaxed to more surely reduce the occurrence of cracks.

When the laminated body may have on the side surface thereof a pair of external electrodes, and the dummy electrode may be electrically insulated from the external electrodes, it is capable of providing the multilayer piezoelectric element having excellent insulation breakdown voltage and exhibiting excellent durability at high electric fields.

In other multilayer piezoelectric element of the invention, between internal electrodes adjacent to each other in the laminating direction of the laminated body through the piezoelectric layer interposed therebetween, a porous part having more voids than these internal electrodes is provided, and a dummy electrode spaced apart and electrically insulated from these internal electrodes is formed between the porous part and at least one of the internal electrodes adjacent to each other. Therefore, even if residual stress is induced by the difference of sintering behavior among the piezoelectric layer connected to the internal electrode, the piezoelectric layer connected to the dummy electrode, and the piezoelectric layer located in the vicinity of the insulating part where neither the internal electrode nor the dummy electrode is formed, the porous part can absorb the residual stress. This enables prevention of cracks caused by the residual stress, thereby providing the multilayer piezoelectric element having excellent durability even if it is driven under high temperature, high humidity and high electric field conditions.

When the dummy electrodes are spaced apart and electrically insulated from one another, the contact area between the dummy electrodes and the piezoelectric layers can be decreased, thereby reducing the occurrence of migration.

When the porous part has at least one of metal parts composed of metal and ceramic parts composed of ceramics, existing between two adjacent piezoelectric layers through a void interposed therebetween, respectively, if the porous part is subjected to stress, the stress can be dispersed into the metal part or the ceramic part, thereby preventing the stress from being concentrated at a point.

When the porous part is provided with the metal part, the Young's modulus of the metal is lower than that of ceramics, thus further enhancing the effect of decreasing stress. When the ceramic part is compared with the metal part, the ceramic part itself is more susceptible to cracking upon induction of stress. Therefore, when the porous part is provided with the ceramic part, the ceramic part itself can be selectively subjected to cracking than other parts during driving, so that the stress can be relaxed at the porous part. This reduces the event that other parts are subjected to cracking. When the porous part is provided with both the metal part and the ceramic part, the pliability owing to the metal part and the stress relaxation effect owing to crack susceptibility of the ceramic part are combined, thereby further enhancing the durability of the piezoelectric element.

When a plurality of the metal parts are spaced apart and electrically insulated from one another, the porous part does not function as an electrode, and hence the amount of displacement of the piezoelectric layer adjacent thereto can be decreased, thereby further enhancing the stress relaxation effect.

When the laminated body is provided with a plurality of the porous parts, and these porous parts are arranged regularly in the laminating direction of the laminated body, the stress relaxation effect can be imparted substantially uniformly almost all over the region in the laminating direction of the laminated body.

When the internal electrodes, adjacent to each other on both sides in the laminating direction with respect to the porous parts through the piezoelectric layer interposed therebetween, respectively, have the same polarity, the piezoelectric layer adjacent to the porous part is not driven, thereby further decreasing the stress.

When the internal electrodes, adjacent to each other on both sides in the laminating direction with respect to the porous parts through the piezoelectric layer interposed therebetween, respectively, have different polarities, the piezoelectric layer adjacent to the porous part is driven, thereby increasing the amount of displacement.

The injection device of the invention, which is provided with the multilayer piezoelectric element having excellent stress relaxation effect, exhibits excellent durability even if it is used under high temperature, high humidity and high electric field conditions.

BEST MODE FOR CARRYING OUT THE INVENTION

<Multilayer Piezoelectric Element>

A multilayer piezoelectric element according to a preferred embodiment of the invention will be described in detail with reference to the accompanying drawings. FIG. 1 is a perspective view showing the multilayer piezoelectric element according to the present preferred embodiment. FIG. 2 is a sectional view taken along the line A-A of the multilayer piezoelectric element. FIG. 3 is an enlarged sectional view showing in enlarged dimension the surroundings of a porous part 17.

As shown in FIGS. 1 to 3, the multilayer piezoelectric element of the present preferred embodiment has a laminated body 10 that a plurality of piezoelectric layers 11 are laminated through an internal electrode 13 interposed therebetween. An internal electrode 13, a dummy electrode 15 spaced apart and electrically insulated from the internal electrode 13, and an insulating part 23 between the dummy electrode 15 and the internal electrode 13 are provided between two adjacent piezoelectric layers 11. The porous parts 17 having a larger number of voids than the internal electrode 13 are formed at positions opposed in the laminating direction to the internal electrode 13, the dummy electrode 15 and the insulating part 23 through the piezoelectric layer 11 interposed therebetween, respectively.

The porous part 17 is preferably composed of at least one of metal and ceramics. When the porous part 17 is composed only of metal, the low Young's modulus of the metal enables a further decrease in stress. When the porous part 17 is composed only of ceramics, the strong connection with the piezoelectric layer enables prevention of the occurrence of cracks. Further, upon induction of large stress, the ceramics part itself is more susceptible to cracking than the metal part. Therefore, when the porous part is provided with the ceramics part, the ceramics part itself can be selectively subjected to cracking and the like than other parts if large stress is induced during driving, thereby enabling the porous part to relax the stress. It is therefore capable of reducing the event that other parts are subjected to cracking and the like. On the other hand, when the porous part 17 is composed of metal and ceramics, both characteristics are combined, thereby decreasing the stress and preventing the occurrence of cracks.

As shown in FIG. 3, more preferably, the porous part 17 is at least one of metal parts 21*a* composed of metal and ceramics parts 21*b* composed of ceramics, existing as a plurality of dots between two adjacent piezoelectric layers 11 through a void 25 interposed therebetween, respectively. Even if the porous part 17 is subjected to stress, local stress concentration can be reduced to further enhance reliability. A plurality of the metal parts 21*a* are preferably dotted spacedly apart and electrically insulatedly from one another, as shown in FIG. 3.

The effect of the invention is attainable even if the porous part 17 is formed at the position opposed in the laminating direction to at least the insulating part 23 through the piezoelectric layer 11 interposed therebetween, as shown in FIG. 4. In this case, the porous parts 17 formed only at the minimum required positions leads to cost reduction, and little deterioration in element strength occurs even if a large number of the porous parts 17 are arranged in the element. As shown in FIG. 5, in the multilayer piezoelectric element, the porous part 17 may be formed at positions opposed on both sides in the laminating direction to the insulating part 23 through the piezoelectric layer 11 interposed therebetween, respectively.

As shown in FIG. 6, a dummy electrode 15 may be electrically connected to an external electrode 19 that is different from the external electrode 19 electrically connected to the internal electrode 13 that exists between the same piezoelectric layers 11 as the dummy electrode 15. As shown in FIG. 7, the dummy electrode 15 may be electrically insulated from the external electrode 19.

Alternatively, as shown in FIG. 8, the dummy electrode 15 is preferably composed of a plurality of dummy parts 15*a* dotted spacedly apart and electrically insulatedly from one another. Since the dummy electrodes are spaced apart and electrically insulated from one another, the occurrence of migration can be further decreased even if a long-term driving is carried out under high temperature, high humidity and high electric field conditions.

As shown in FIG. 9, the internal electrodes 13, which are adjacent to each other on both sides in the laminating direction with respect to the porous part 17 through the piezoelectric layer 11 interposed therebetween, respectively, may have the same polarity. As shown in FIG. 10, the internal electrodes 13, which are adjacent to each other on both sides in the laminating direction with respect to the porous part 17 through the piezoelectric layer 11 interposed therebetween, respectively, may have different polarities.

In the multilayer piezoelectric element of the present preferred embodiment, the dummy electrodes 15 insulated from the internal electrodes 13 are arranged, and the porous part 17 having a larger number of the voids 25 than the internal electrodes 13 is arranged at the position adjacent to the internal electrode 13 in the laminating direction. That is, the residual stress during sintering can be decreased by the dummy electrodes 15, and the porous part 17 having a large number of the voids 25 is arranged at the position adjacent in the laminating direction, so that the porous part 17 can effectively absorb stress even if driven under high temperature, high humidity and high electric field conditions. This enables to reduce the problems that cracks occur and the water vapor in the atmosphere enters thereinto, and migration occurs, and electrical conduction between the internal electrodes 13 is established.

It is desirable that the dummy electrodes 15 contain the same metal composition as the internal electrodes 13 in order to bring their shrinkage during sintering near that of the internal electrodes 13. Preferably, the same composition as the internal electrodes is desirable. By using the same composition as the internal electrodes, the shrinkage during sintering can be identical to that of the internal electrodes 13, thereby decreasing the residual stress.

The porosity of the porous parts 17 is desirably 10 to 95% in order to further enhance stress decreasing effect. The porosity falling within this range enables to maintain high connection strength between the porous parts 17 and the piezoelectric layer 11 adjacent thereto, and also effectively decrease stress, thereby preventing the occurrence of cracks. Preferably, the porosity is 40 to 90%.

The porosity of the porous parts 17 is expressed as a percentage of the amount of the voids 25 in the entire area of the porous parts 17 (the area of the regions sandwiched by the piezoelectric layers 11) in a cross section parallel to the laminating direction of the laminated body.

The metal filling factor of the porous parts 17 is preferably 5 to 55%. The metal filling factor of not less than 5% enables reduction of excess deterioration of the connection strength between the metal parts 21*a* and the piezoelectric layer adjacent thereto. The metal filling factor of not more than 55% enables the state that a plurality of the metal parts 21*a* are properly dotted, thereby enhancing stress absorbing effect. This enables effective reduction of the occurrence of cracks. The metal filling factor is more preferably 10 to 40%. The metal filling factor is expressed as a percentage of the amount of the metal parts 21*a* in the entire area of the porous parts 17 in a cross section parallel to the laminating direction of the element.

The dimension (the length in the laminating direction) of the metal parts 21*a* is preferably 1 to 100 μm, more preferably 3 to 50 μm. The metal parts 21*a* having a dimension of not less than 1 μm can reduce the fear that the stress relaxation effect is deteriorated due to an excessive small thickness of the metal parts 21*a*. The metal parts 21*a* having a dimension of not more than 100 μm can reduce the fear that the metal parts 21*a* deteriorate the effect of dispersedly absorbing the stress caused by the laminated body extension and contraction. The metal parts 21*a* may have a substantially spherical shape or other shape.

Inactive layers 9 are arranged on both ends in the laminating direction of the laminated body 10, respectively. The inactive layers 9 are layers composed of a plurality of piezoelectric layers not provided with the internal electrode 13, and therefore no displacement occurs upon application of a voltage.

The external electrodes 19 are connected to the opposed side surface of the laminated body, respectively. The laminated internal electrodes 13 are alternately electrically connected to these external electrodes 19. Therefore, a voltage necessary for displacing the piezoelectric layer 11 by using the reverse piezoelectric effect can be commonly supplied to the connected individual internal electrodes 13. Lead lines are connected and fixed to the external electrodes 19 by soldering or the like, thus enabling the external electrodes 19 to be connected to an external voltage supply part.

Preferably, a pair of the external electrodes 19 are formed on the side surfaces of the laminated body, a plurality of the internal electrodes 13 are alternately electrically connected to these external electrodes 19, and the dummy electrode 15 is electrically connected to the external electrode 19 that is different from the external electrode 19 to which the internal electrode 13, existing between the same piezoelectric layers 11 as the above-mentioned dummy electrode 15, is connected. Thus, in-plane stress nonuniformity can be decreased to further enhance crack-reducing effect.

Alternatively, a pair of the external electrodes 19 may be formed on the side surfaces of the laminated body, and a plurality of the internal electrodes 13 may be alternately electrically connected to these external electrodes 19, and the dummy electrode 15 may be insulated from the external electrodes 19. Thus, the external electrodes 19 and the dummy electrode 15 are insulated from each other, thereby providing the multilayer piezoelectric element having excellent insulation breakdown voltage and exhibiting excellent durability even at high electric fields.

Preferably, a plurality of the porous parts 17 are present and regularly arranged in the laminating direction of the laminated body. The porous parts 17 having stress relaxation effect are arranged regularly in the laminating direction of the laminated body, so that the stress can be relaxed substantially uniformly over the entire region in the laminating direction of the laminated body.

The porous parts 17 are preferably arranged by interposing therebetween not more than a half the number of laminations of the laminated body (the total number of the internal electrodes 13). By setting the spatial intervals of the porous parts 17 to a half the number of laminations of the laminated body, the stress can be decreased uniformly over the entire region of the side surface of the laminated body. This avoids the problem that when a long-term continuous driving is carried out under high temperature, high humidity, high electric field and high pressure conditions, cracks occur, water vapor enters thereinto, migration occurs, and the electrical conduction between the internal electrodes 13 is established, causing malfunctioning of the laminate. The spatial intervals of the porous parts 17 are more preferably not more than one eighth the number of laminations of the laminated body. Although it is preferable that the porous parts 17 are regularly arranged in the laminating direction of the laminated body, both ends in the laminating direction may deviate from the regularity at the center of the laminated body.

Preferably, the internal electrodes 13, which are adjacent to each other on both sides in the laminating direction with respect to the porous part 17 through the piezoelectric layers 11 interposed therebetween, respectively, have the same polarity. In this case, the porous part 17 is not driven, further enhancing the stress relaxation effect. On the other hand, if priority is given to the attainment of more amount of displacement, the internal electrodes 13, which are adjacent to each other on both sides in the laminating direction with respect to the porous part 17 through the piezoelectric layers 11 interposed therebetween, respectively, should preferably have different polarities. In this case, the porous part 17 is driven, and hence the amount of displacement can be increased, thereby providing the multilayer piezoelectric element that is small and achieves a large amount of displacement.

The thickness of the piezoelectric layer 11, namely the distance between the internal electrodes 13 is desirably 40 to 250 μm. Thus, even if the number of laminations in the multilayer piezoelectric element is increased to obtain more amount of displacement by applying a voltage, the downsizing and low profile of the multilayer piezoelectric actuator can be achieved, and the insulation breakdown of the piezoelectric layers 11 can be prevented.

FIG. 11 is a perspective view showing a multilayer piezoelectric element according to a second preferred embodiment of the invention. FIG. 12 is a sectional view thereof. FIG. 13 is an enlarged sectional view showing in enlarged dimension the surroundings of porous parts 17. In the multilayer piezoelectric element of the present preferred embodiment, as shown in FIGS. 12 and 13, there are provided the porous parts 17 having a large number of voids than internal electrodes 13, and a dummy electrode 15 spaced apart and electrically insulated from these internal electrodes 13 is interposed between the porous part 17 and at least one of these internal electrodes 13. That is, the dummy electrode 15 decreases the residual stress during sintering, and the porous parts 17 having a larger number of voids 25 are arranged at positions adjacent to each other in the laminating direction. Therefore, the porous parts 17 can absorb stress even if driven under high temperature, high humidity and high electric field conditions. This enables to reduce the problems that cracks occur and the water vapor in the atmosphere enters thereinto, and migration occurs, and the electrical conduction between the internal electrodes 13 is established.

As shown in FIG. 13, the porous part 17 is preferably at least one of a metal part 21*a* composed of metal and a ceramics part 21*b* composed of ceramics, existing as a plurality of dots between two adjacent piezoelectric layers 11 through a void 25 interposed therebetween, respectively. Especially, a plurality of the metal parts 21*a* are preferably dotted spacedly apart and electrically insulatedly from one another.

Preferably, the laminated body is provided with a plurality of the porous parts 17, and these porous parts 17 are regularly arranged in the laminating direction of the laminated body. As shown in FIG. 14, the dummy electrodes 15 are preferably dotted spacedly apart and electrically insulated from one another. As shown in FIG. 15, the internal electrodes 13, which are adjacent to each other on both sides in the laminating direction with respect to the porous part 17 through the piezoelectric layers 11 interposed therebetween, respectively, may have the same polarity. Alternatively, as shown in FIG. 16, the internal electrodes 13, which are adjacent to each other on both sides in the laminating direction with respect to the porous part 17 through the piezoelectric layers 11 interposed therebetween, respectively, may have different polarities.

Alternatively, the dummy electrodes 15 may be arranged side by side in the laminating direction, instead of arranging on the same plane as the internal electrode 13. Thus, even if the electric field strength applied to the piezoelectric layer 11 sandwiched between the internal electrodes is subjected to variations of in-plane distribution in the same plane due to variations in the shape and polarization capability of piezoelectric particles, the electric field strength within the same plane can be corrected by the presence of the dummy electrodes 15. This leads to substantially uniform electric field strength within the same plane. Therefore, it is possible to avoid the event that the porous parts 17 arranged for the stress concentration of the element are subjected to stress concentration caused by local concentration of electric field strength. As a result, by allowing the porous parts 17 to effectively function as a stress relaxation layer, the multilayer piezoelectric element can have extremely high durability.

Preferably, the dummy electrode 15 is interposed between the internal electrodes 13 adjacent to each other on both sides in the laminating direction with respect to the porous parts 17, respectively. Since the dummy electrodes 15 are arranged above and below the porous part 17, the residual stress during sintering can be further decreased, and the stress induced at the porous parts 17 can also be decreased. Without limiting to the location between the piezoelectric layers 11 where the internal electrodes 13 adjacent to each other are arranged on both sides in the laminating direction with respect to the porous part 17, respectively, the dummy electrodes 15 may be arranged at all the locations between the piezoelectric layers 11 where the internal electrode 13 is arranged.

Other parts and other characteristics are identical to those described in the first preferred embodiment, and the description thereof is therefore omitted.

<Manufacturing Method>

A method of manufacturing the multilayer piezoelectric elements of the invention as described above will next be described. The manufacturing method of the invention includes the step of forming, on a surface of a ceramic green sheet 11*a*, an internal electrode paste layer 13*a* containing a metal composition $M_1$, and forming a dummy electrode paste layer containing a metal composition $M_1$ while leaving a spaced part from the internal electrode paste layer 13*a* in order to form an insulating part 23, the step of forming a stress relaxation paste layer 17*a* containing a metal composition $M_1$ at a position corresponding to the spaced part on a surface of other ceramic green sheet 11*a*, the step of forming a molded laminate by adjacently laminating these ceramic green sheets 11*a*, and the step of sintering the molded laminate.

The stress relaxation paste layer 17*a* has a higher ratio X of the metal composition $M_1$ to the total amount of the metal composition than the internal electrode paste layer 13*a* and the dummy electrode paste layer.

Preferably, the stress relaxation paste layer 17*a* is formed at positions corresponding to the internal electrode paste layer 13*a*, the dummy electrode paste layer and the spaced part therefrom, respectively.

As a piezoelectric material, for example, piezoelectric ceramics material can be used which is composed mainly of lead zirconium titanate ($Pb(Zr, Ti)O_3$, hereinafter abbreviated as PZT) or barium titanate ($BaTiO_3$). The piezoelectric ceramics is desirably high in piezoelectric distortion constant $d_{33}$ indicating the piezoelectric characteristic thereof.

The manufacturing method of the invention will be described below in more detail taking for example the case of using silver as the metal composition $M_1$. Firstly, slurry is prepared by mixing lead zirconium titanate (PZT) powder, binder composed of acrylic or butyral organic polymer, and plasticizer such as DBP (dibutyl phthalate), DOP (dioctyl phthalate) or the like. The slurry is then subjected to a known tape forming method such as doctor blade method, calendar roll, thereby obtaining ceramic green sheets.

Subsequently, a metal paste for the internal electrodes 13 and a metal paste for the dummy electrodes 15 are prepared. These metal pastes are obtained by adding and mixing binder, plasticizer and the like to metal powder composed mainly of silver palladium. The internal electrode paste layers 13*a* and the dummy electrode paste layers 15*a* are formed by printing these metal pastes on one surface of each of these ceramic green sheets 11*a* by screen printing or the like.

A metal paste for porous parts 17 having high porosity is also prepared. This metal paste is obtained, for example, by adding and mixing binder, plasticizer and the like to metal power composed mainly of silver, or alternatively, obtained by adding and mixing binder, plasticizer and the like to metal powder composed of silver palladium, whose silver ratio is increased than the metal pastes for the internal electrodes 13 and the dummy electrodes 15. The metal paste thus obtained is then printed on one surface of these ceramic green sheets 11*a* by screen printing or the like. At this time, a stress relaxation paste layer 17*a* containing silver is formed at the positions corresponding to the spaced parts, respectively. The stress relaxation paste layer 17*a* is preferably formed at positions corresponding to the internal electrode paste layers 13*a*, the dummy electrode paste layers 15*a* and the spaced parts therefrom, respectively.

Subsequently, a molded laminate before sintering is obtained by laminating and drying the green sheets on which these metal pastes are printed so as to have, for example, the structure shown in FIG. 2. FIG. 17(*a*) is a sectional view showing in enlarged dimension a part of the molded laminate. When it is necessary to further increase the ceramic layer thickness, only the green sheets on which no metal paste is printed may be partially laminated at the locations for which the thickness is necessary. The molded laminate can be cut into the desired form. The thickness of the metal paste layer can be controlled to approximately 1 to 40 μm by employing screen printing.

The molded laminate is then subjected to debinding process at a predetermined temperature, followed by sintering at 800 to 1000° C. As a result, the silver is diffused from the metal layer having a high silver concentration to an alloy layer (refer to FIG. 17(*b*)), thereby forming porous parts 17 having a high porosity, and relatively dense internal electrodes 13 (FIG. 17(*c*)).

After the sintered body is machined into the desired dimension, external electrodes 19 are formed. The external electrodes 19 can be formed as follows. That is, a metal paste is obtained by adding and mixing binder, plasticizer, glass powder and the like to metal powder composed mainly of silver. The metal paste is then printed on the side surface of the above-mentioned sintered body by screen printing or the like, followed by sintering at 600 to 800° C. The silver is diffused from the metal paste layer having a high silver concentration to the metal paste layer having a low silver concentration, resulting in the porous parts 17 having a high porosity.

Other method of manufacturing the multilayer piezoelectric element of the invention is as follows. Porous parts 17 having an arbitrary porosity can be formed by incorporating an organic matter such as acryl beads, which are bindingly fixed during drying, and volatized during sintering, into a paste in which a metal composition such as silver-palladium, and the calcined powder of piezoelectric ceramics and the like when necessary, are added and mixed. That is, the porosity of the porous parts 17 can be controlled by controlling the amount of acryl beads to be added to the paste. Specifically, when the amount of acryl beads is small, the porosity is small. On the other hand, when the amount of acryl beads is large, the porosity is large. Otherwise, the method is the same as described above, and therefore the description thereof is omitted.

At this time, the metal powder constituting the internal electrodes 13, such as silver-palladium, is added into the green sheets constituting inactive layers. Alternatively, when laminating the green sheets constituting the inactive layers 9, slurry composed of the metal powder constituting the internal electrodes 13, such as silver-palladium, and an inorganic compound and binder and plasticizer is printed on the green sheets. Thereby, the shrinkage behavior and shrinkage percentage during sintering of the inactive layers 9 and those of other parts can be matched to enable formation of a dense laminated body.

The laminated body 10 should not be limited to that manufactured by the above manufacturing method, and it may be formed by any manufacturing method capable of manufacturing the laminated body that a plurality of the piezoelectric layers and a plurality of the internal electrodes 13 are laminated alternately.

Next, the obtained multilayer sintered body is ground into a predetermined shape.

Thereafter, a conductive silver glass paste, which is prepared by adding binder, plasticizer and solvent to conductive agent powder and glass powder, is printed onto the side surface of the laminated body on which external electrodes 19 will be formed, by screen printing or the like. This is then dried and baked at a predetermined temperature, thereby forming the external electrodes 19.

Further, a conductive auxiliary member composed of conductive adhesive, in which a metal mesh or a mesh-shaped metal plate is buried, may be formed on the external surfaces of the external electrodes 19. In this case, when a large current is flown into the actuator so as to be driven at high speed by providing the conductive auxiliary member on the external surfaces of the external electrodes 19, the large current can be flown into the conductive auxiliary member, thereby decreasing the current passing through the external electrodes 19. For this reason, it is possible to prevent that the external electrodes 19 are disconnected due to local heat generation, enabling considerable improvement of durability.

Additionally, it is also possible to prevent that the conductive adhesive is subjected to cracking, because the metal mesh or the mesh-shaped metal plate buried in the conductive adhesive.

The metal mesh means one in which metal lines are knitted. The mesh-shaped metal plate means that a metal plate has a mesh shape by forming holes there.

Thereafter, the multilayer piezoelectric element of the invention is completed by connecting lead lines to the external electrodes 19 by soldering or the like, and then coating exterior resin composed of silicone rubber and the like onto the side surface of the laminated body including the external electrodes 19 by using a technique such as dipping.

<Injection Device>

FIG. 18 shows the injection device of the invention. An injection hole 33 is provided at one end of a container 31, and a needle valve 35 capable of opening and closing the injection hole 33 is housed in the container 31.

The injection hole 33 is provided with a fuel passage 37 so as to permit communication, and the fuel passage 37 is connected to an external fuel supply source, and fuel is normally supplied to the fuel passage 37 at a constant high pressure. Therefore, it is configured so that when the needle valve 35 opens the injection hole 33, the fuel being supplied to the fuel passage 37 is jetted at a constant high pressure into a fuel room (not shown) of an internal combustion engine.

The upper end of the needle valve 35 has a large diameter to provide a cylinder 39 and a slidable piston 41 which are formed in the container 31. The container 31 houses the above-mentioned piezoelectric actuator 43.

In the above injection device, when the piezoelectric actuator 43 extends upon application of a voltage, the piston 41 is pressed, and the needle valve 35 closes the injection hole 33, thereby stopping the fuel supply.

It is also configured so that when the voltage application is stopped, the piezoelectric actuator 43 contracts, and a coned disc spring 45 pushes back the piston 41, and the injection hole 33 is communicated with the fuel passage 37, thereby performing fuel jetting.

<Fuel Injection System>

FIG. 19 is a schematic diagram showing the fuel injection system according to a preferred embodiment of the invention.

As shown in FIG. 19, the fuel injection system 51 of the present preferred embodiment is provided with a common rail 52 for storing high-pressure fuel, a plurality of the injection devices 53 for injecting the fuel stored in the common rail 52, a pressure pump 54 for supplying the high-pressure fuel to the common rail 52, and an injection control unit 55 for supplying drive signals to these injection devices 53.

The injection control unit 55 controls the amount and timing of fuel injection while sensing the situations within the combustion room of the engine by a sensor or the like. The pressure pump 54 functions to deliver the fuel from a fuel tank 56 to the common rail 52 under atmospheric pressure of approximately 1000 to 2000, preferably approximately 1500 to 1700. The common rail 54 stores the fuel delivered from the pressure pump 54, and suitably delivers it to the injection devices 53. The injection devices 53 inject a small amount of fuel in mist form through the injection hole 33 into the combustion room as described above.

EXAMPLE 1

A piezoelectric actuator constructed from the multilayer piezoelectric element of the invention was manufactured as follows. Firstly, slurry was prepared by mixing calcined powder composed mainly of lead zirconate titanate ($PbZrO_3$—$PbTiO_3$) having a mean particle size of 0.4 μm, binder and plasticizer. Then, ceramic green sheets constituting piezoelectric layers 11 having a thickness of 120 μm were formed by doctor blade method.

A conductive paste, in which binder was added to silver-palladium alloy (95% by mass of silver and 5% by mass of palladium), was formed by screen printing method at the regions for internal electrodes, and the regions for dummy electrodes when necessary. The conductive paste was printed on one surface of each ceramic green sheet, and 300 pieces of the obtained sheets were laminated. Subsequently, a conductive paste composed of silver-palladium alloy (99% by mass of silver and 1% by mass of palladium) was printed at the region for porous parts having a larger number of voids by changing the pattern of screen printing, followed by sintering. That is, this was retained at 800° C. and sintered at 950° C. and then heated and retained at 900° C. for one hour, followed by cooling.

At this time, the arrangement of the porous parts having a large number of voids, the connection of the dummy electrodes to the outside electrodes, and the arrangement of polarities of the internal electrodes overlying and underlying the porous parts were carried out as shown in Table 1.

Next, to a mixture of flake-shaped silver powder having a mean particle size of 2 μm, and the rest as being amorphous glass powder composed mainly of silicon having a mean particle size of 2 μm and a softening point of 640° C., 8 parts by mass of binder were added with respect to 100 parts by mass of the mixture of the silver powder and the glass powder, and then sufficiently mixed together to obtain a silver glass conductive paste.

Subsequently, the silver glass conductive paste was printed on the surfaces of the external electrodes 15 of the laminated body 13, and this was dried and then baked at 700° C. for 30 minutes, thereby forming the external electrodes 15.

Thereafter, the polarization processing was performed by connecting lead wires to the external electrodes 15, and then applying through the lead wires a DC electric field of 3 kV/mm for 15 minutes to the positive electrodes and the negative electrodes of the external electrodes 15, respectively. Thus, the piezoelectric actuator using the multilayer piezoelectric element as shown in FIG. 1 was manufactured.

By applying a DC voltage of 170V to the obtained multilayer piezoelectric elements, the amount of displacement in the laminating direction was obtained in every piezoelectric actuator.

Further, the following test was conducted. That is, each of the piezoelectric actuators was continuously driven up to $1\times10^9$ times by applying AC voltages of 0 to +170V at frequency of 150 Hz at room temperature. After the continuous driving test, the cross sections of some of these actuators were ground and the inside thereof was observed by a metal microscope. Separately, a voltage was applied to the piezoelectric actuators manufactured under the same conditions, and their insulation breakdown voltages were measured. The results are shown in Table 1.

TABLE 1

| Sample No. | Existence of dummy electrode layer | Existence of porous layer | Location of porous layer | Connection to the outside electrode different from inner electrode | Arrangement of porous parts | Laminated location of porous layers arranged | Inner electrode layers overlying and underlying porous layer | Initial amount of displacement (μm) | Amount of displacement after $1 \times 10^9$ cycles (μm) | Delamination | Insulation breakdown voltage (V) |
|---|---|---|---|---|---|---|---|---|---|---|---|
| 1 | Existence | Non-existence | — | — | — | | — | 40 | 24 | Existence | — |
| 2 | Existence | Existence | One side | Connected | Randomly | 30th, 100th and 200th layers | Same polarity | 40 | 38 | Nonexistence | — |
| 3 | Existence | Existence | Both sides | Connected | Randomly | 30th, 100th and 200th layers | Same polarity | 40 | 40 | Nonexistence | 850 |
| 4 | Existence | Existence | Both sides | Unconnected | Randomly | 30th, 100th and 200th layers | Same polarity | 40 | 39 | Nonexistence | 910 |
| 5 | Existence | Existence | One side | Connected | Regularly | 75th, 150th and 225th layers | Same polarity | 40 | 39 | Nonexistence | 870 |
| 6 | Existence | Existence | Both sides | Unconnected | Regularly | 75th, 150th and 225th layers | Same polarity | 40 | 40 | Nonexistence | 915 |
| 7 | Existence | Existence | Both sides | Unconnected | Regularly | 75th, 150th and 225th layers | Unlike polarity | 42 | 42 | Nonexistence | 900 |

As apparent from Table 1, in Sample No. 1 as a comparative example, a considerable decrease in the amount of displacement was observed after the $1\times10^9$ cycles because no porous part capable of relaxing stress was arranged in the active part, and delamination (inter-layer peeling) was confirmed in the vicinity of the external electrodes.

On the other hand, Samples Nos. 2 to 7 as the preferred embodiments of the invention had an effective amount of displacement required for the multilayer piezoelectric elements, respectively, without causing any extreme deterioration from the initial amount of displacement even after the continuous driving test. These samples enabled manufacture of the multilayer piezoelectric elements having durability and causing neither delamination nor malfunction.

Among others, Samples Nos. 4, 6 and 7 enabled manufacture of the multilayer piezoelectric elements having excellent insulation breakdown voltage. Especially, Sample No. 6 achieved the multilayer piezoelectric element having extremely excellent durability with improved insulation breakdown voltage, causing no change of element performance after the continuous driving, while ensuring the effective amount of displacement from the beginning.

EXAMPLE 2

Piezoelectric actuators were manufactured in the same manner as in Example 1, except that dummy electrodes are arranged on a different ceramic green sheet from internal electrodes, a predetermined number of green sheets to which the same conductive paste as the internal electrodes was applied were printed, and the arrangement of the dummy electrodes, the arrangement of porous parts having a large number of voids, and the arrangement of polarities of the internal electrodes overlying and underlying the porous parts were carried out as shown in Table 2.

By applying a DC voltage of 170V to the obtained multilayer piezoelectric elements, the amount of displacement in the laminating direction was obtained in every piezoelectric actuator.

Further, the following test was conducted. That is, each of the piezoelectric actuators was continuously driven up to $1\times10^9$ times by applying AC voltages of 0 to +170V at frequency of 150 Hz at room temperature. After the continuous driving test, the cross sections of some of these actuators were ground, and the inside thereof was observed by a metal microscope. The results are shown in Table 2.

TABLE 2

| Sample No. | Existence of dummy electrode layer | Location of dummy electrode layer | Existence of porous layer | Arrangement of porous parts | Laminated location of porous layers arranged | Inner electrode layers overlying and underlying porous layer | Initial amount of displacement (μm) | Amount of displacement after $1\times10^9$ cycles (μm) | Delamination |
|---|---|---|---|---|---|---|---|---|---|
| 11 | Existence | Between inner electrode layer | Non-existence | — | | — | 40 | 25 | Existence |
| 12 | Existence | One side of porous layer | Existence | Randomly | 30th, 100th and 200th layers | Same polarity | 40 | 39 | Nonexistence |
| 13 | Existence | Both sides of porous layer | Existence | Randomly | 30th, 100th and 200th layers | Same polarity | 40 | 39 | Nonexistence |
| 14 | Existence | One side of porous layer | Existence | Regularly | 75th, 150th and 225th layers | Same polarity | 40 | 40 | Nonexistence |
| 15 | Existence | One side of porous layer | Existence | Regularly | 75th, 150th and 225th layers | Unlike polarity | 42 | 42 | Nonexistence |

As apparent from Table 2, in Sample No. 11 as a comparative example, a considerable decrease in the amount of displacement was observed after the $1\times10^9$ cycles because no porous part capable of relaxing stress was arranged in the active part, and delamination was confirmed in the vicinity of the external electrodes.

On the other hand, Samples Nos. 12 to 15 as the preferred embodiments of the invention had an effective amount of displacement required for the multilayer piezoelectric elements, respectively, without causing any extreme deterioration from the initial amount of displacement even after the continuous driving test. These samples enabled manufacture of the multilayer piezoelectric elements having durability and causing neither delamination between the internal electrodes nor malfunction.

Explanation of Reference

Figure 1:
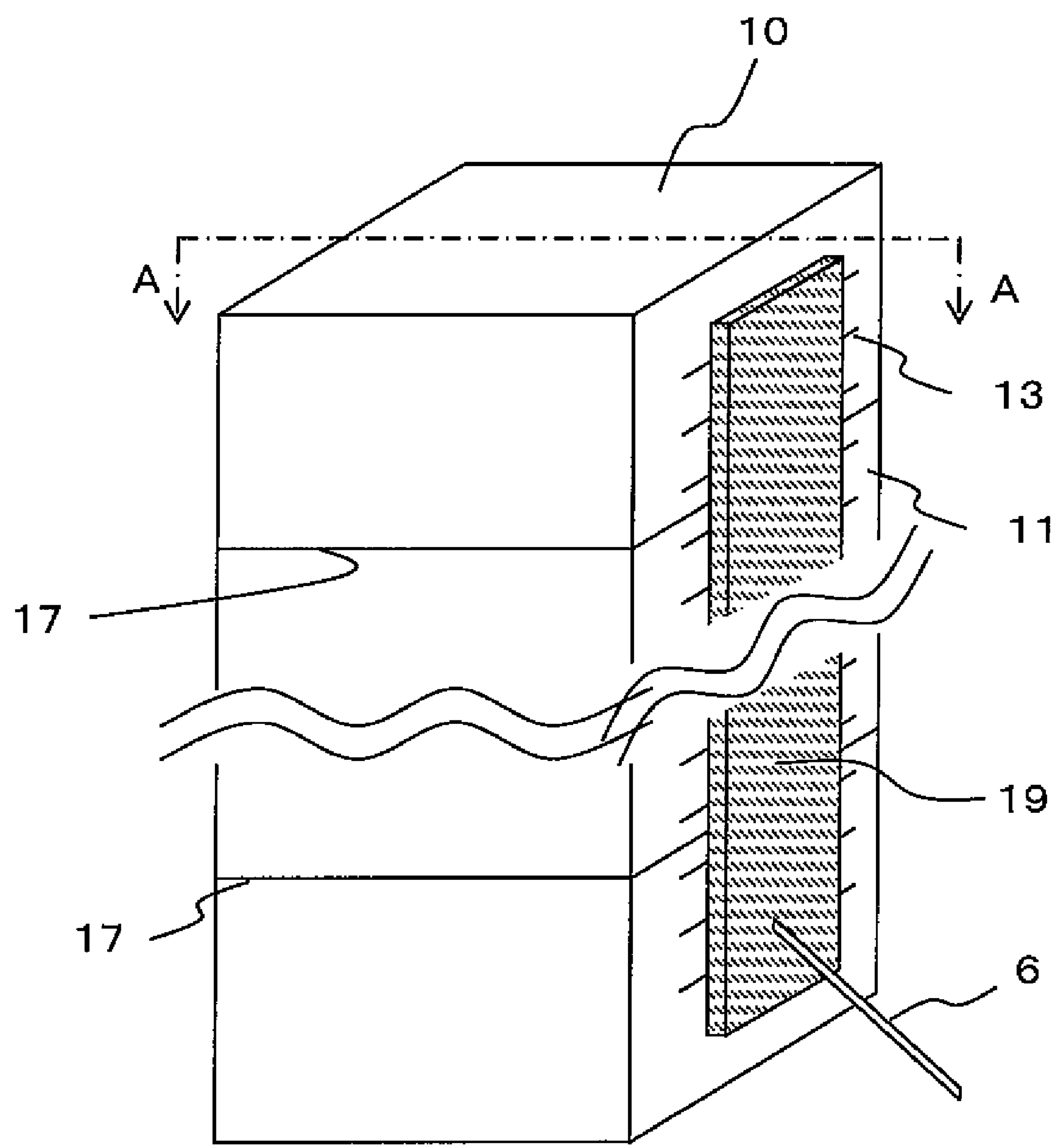
FIG. 1 is a perspective view showing a multilayer piezoelectric element according to a first preferred embodiment of the invention.
Figure 2:
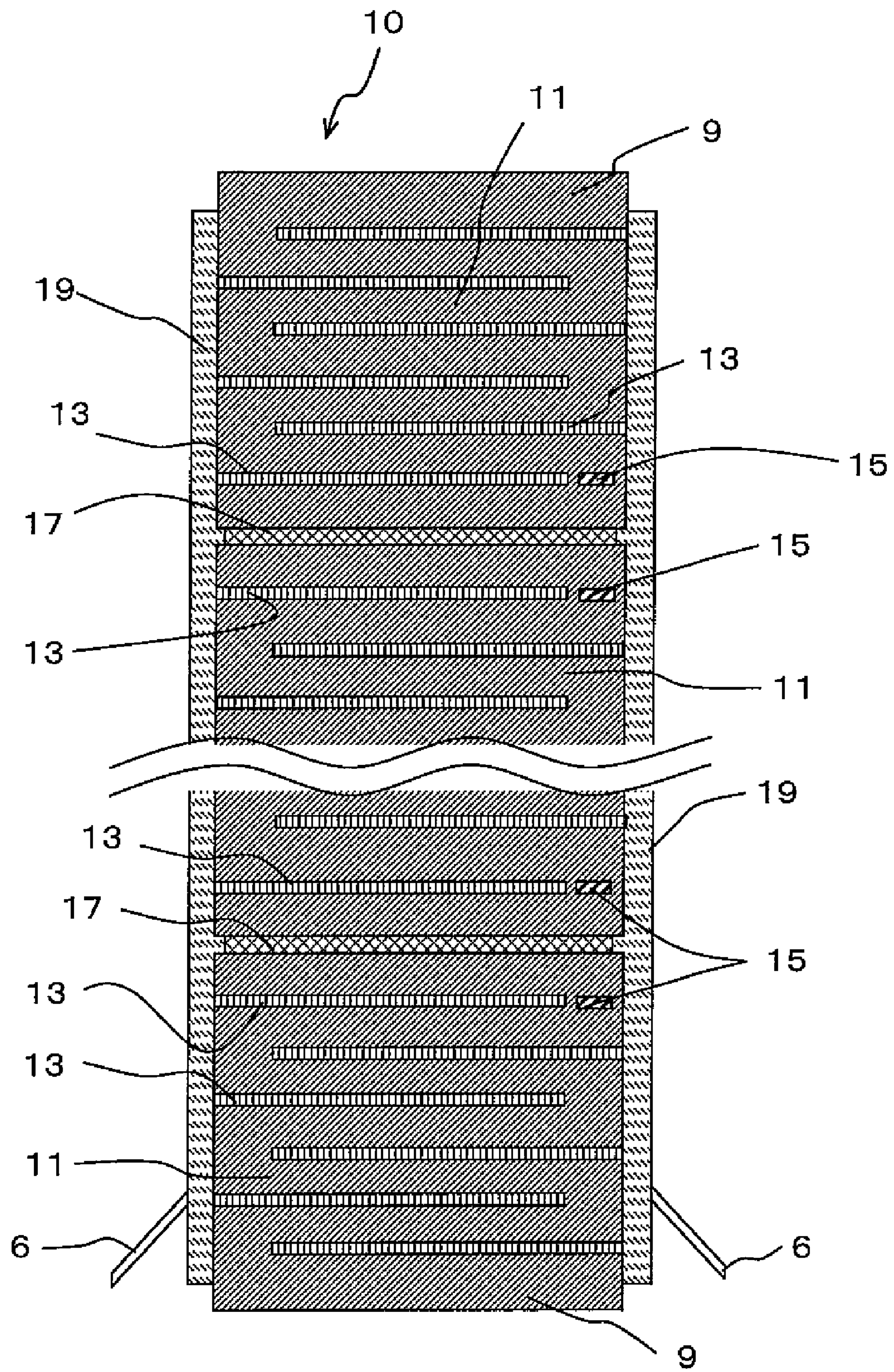
FIG. 2 is a sectional view taken along the line A-A of the multilayer piezoelectric element shown in FIG. 1.
Figure 3:
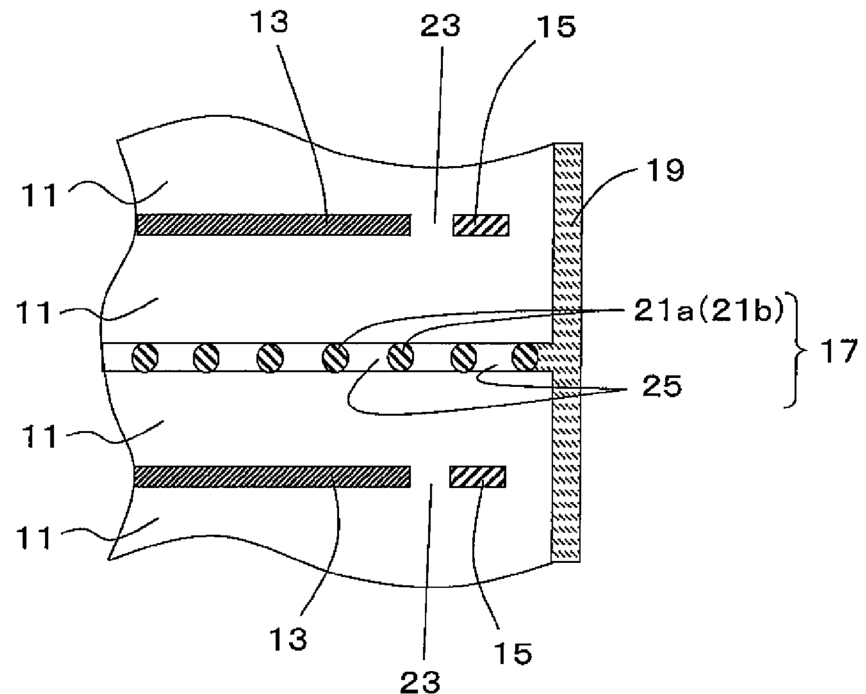
FIG. 3 is a sectional view showing in enlarged dimension a part of the multilayer piezoelectric element shown in FIG. 1.
Figure 4:
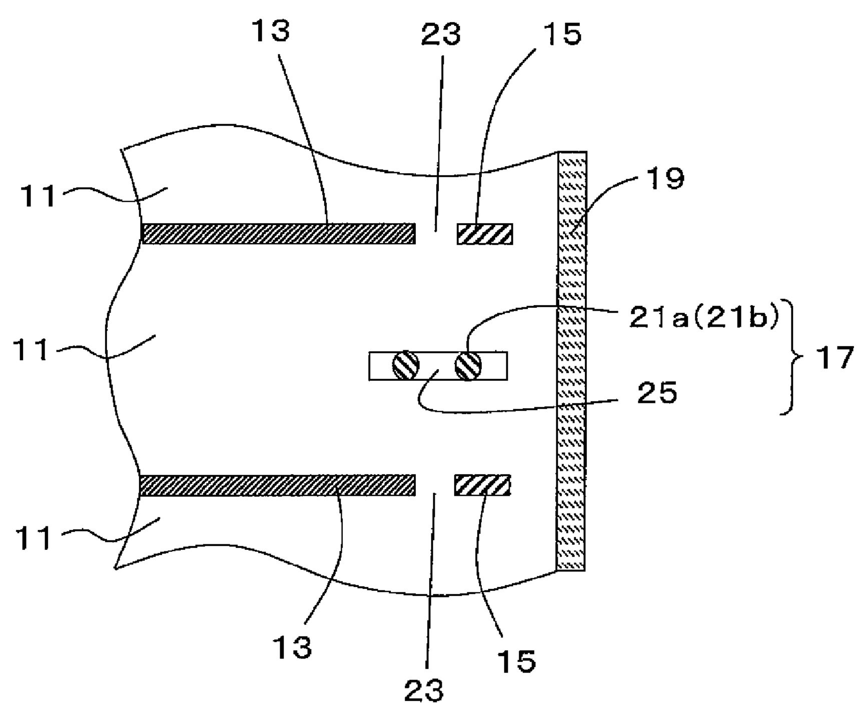
FIG. 4 is a sectional view showing other example of the first preferred embodiment (a sectional view when cut by a plane parallel to the laminating direction)
Figure 5:
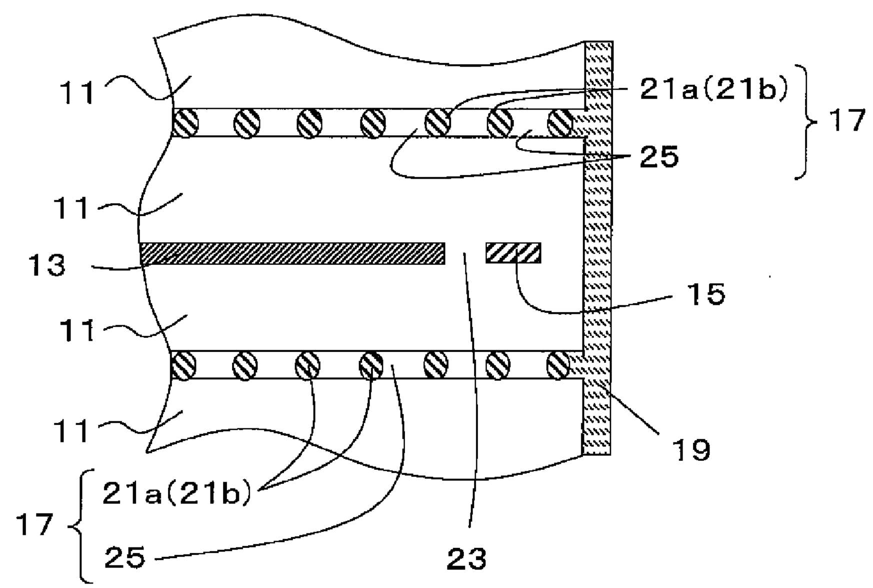
FIG. 5 is a sectional view showing a still other example of the first preferred embodiment (a sectional view when cut by a plane parallel to the laminating direction)
Figure 6:
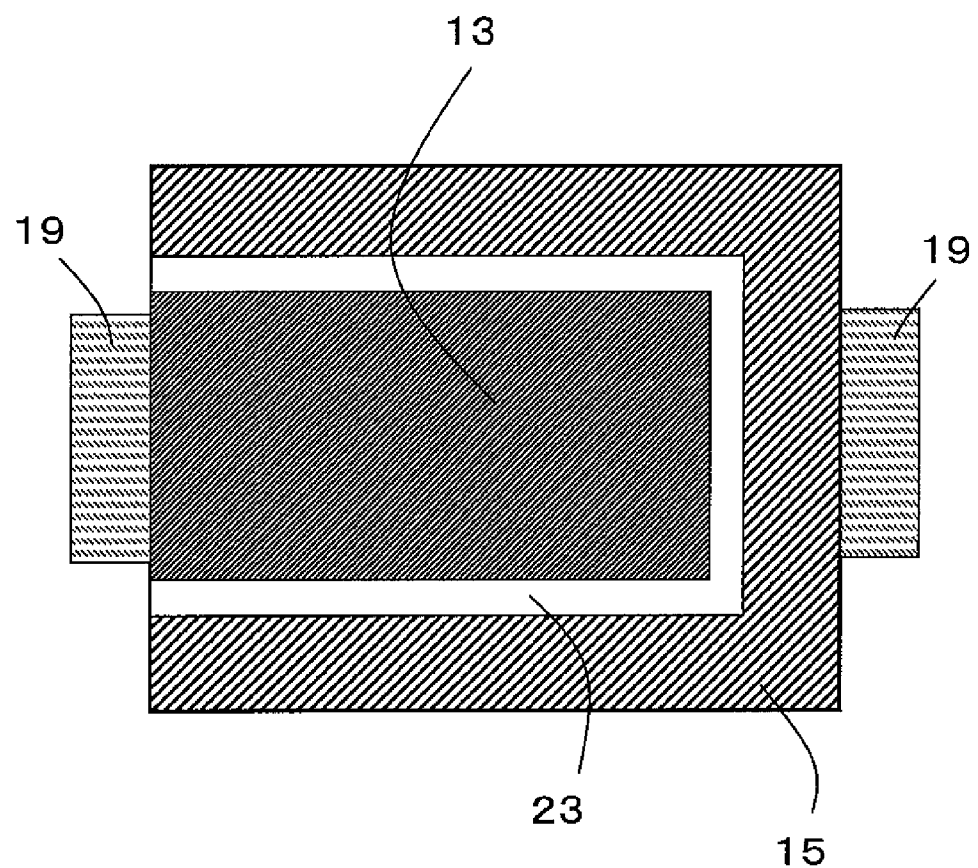
FIG. 6 is a sectional view when the multilayer piezoelectric element of the first preferred embodiment is cut by a plane perpendicular to the laminating direction.
Figure 7:
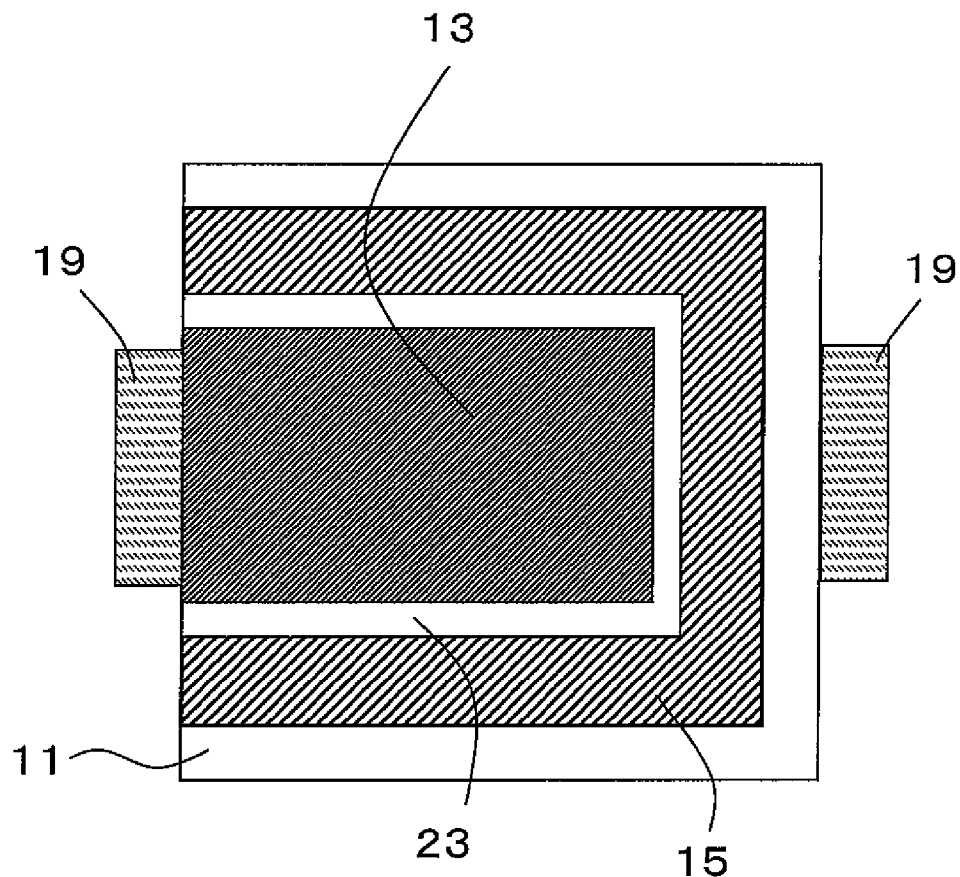
FIG. 7 is another sectional view when the multilayer piezoelectric element of the first preferred embodiment is cut by a plane perpendicular to the laminating direction.
Figure 8:
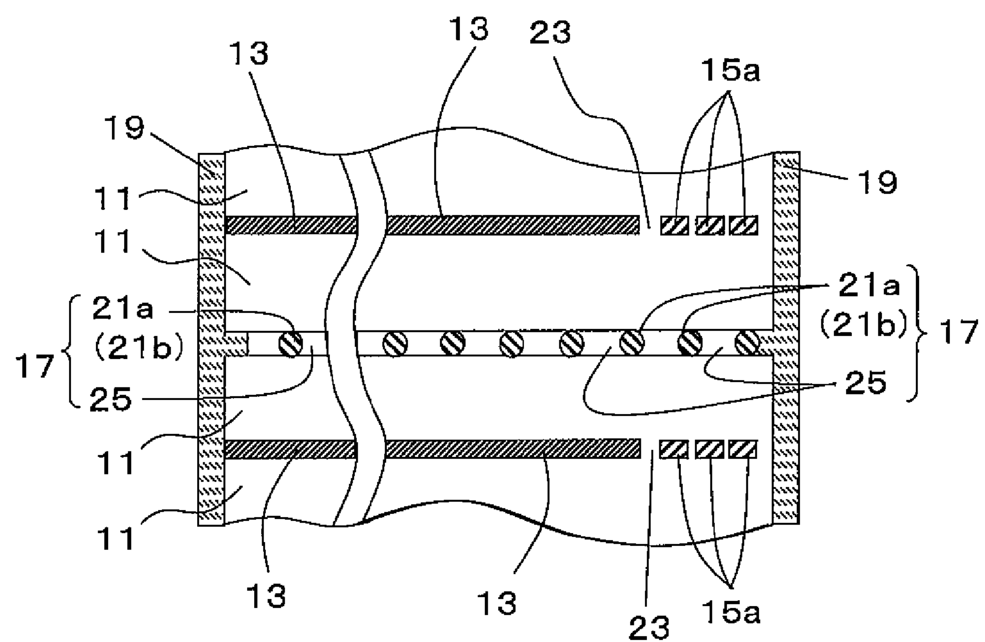
FIG. 8 is a sectional view showing a still other example of the first preferred embodiment (a sectional view when cut by a plane parallel to the laminating direction)
Figure 9:
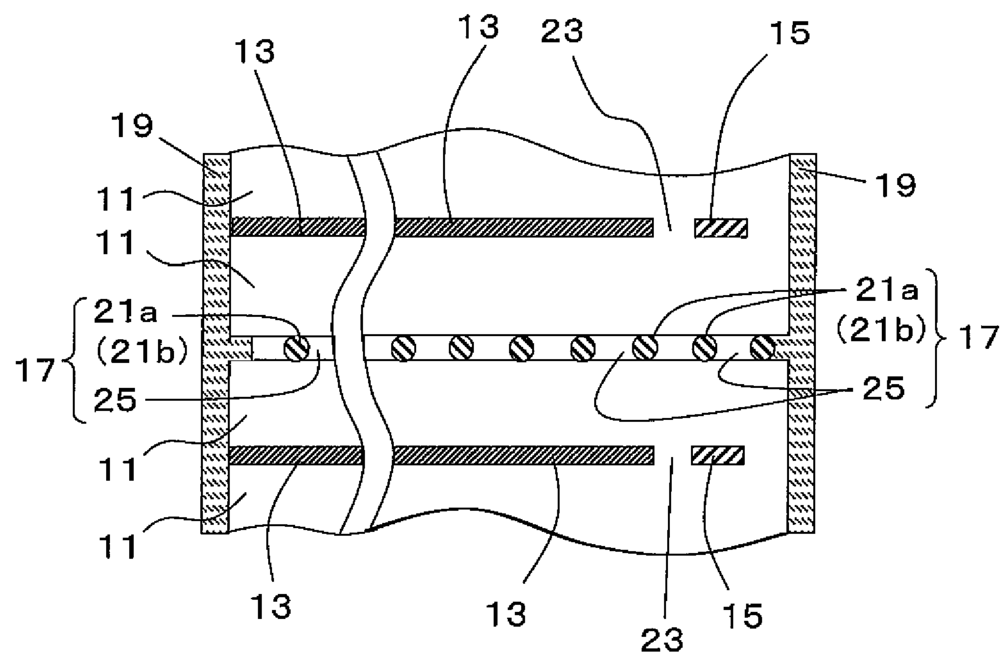
FIG. 9 is other sectional view showing a still other example of the first preferred embodiment (a sectional view when cut by a plane parallel to the laminating direction)
Figure 10:
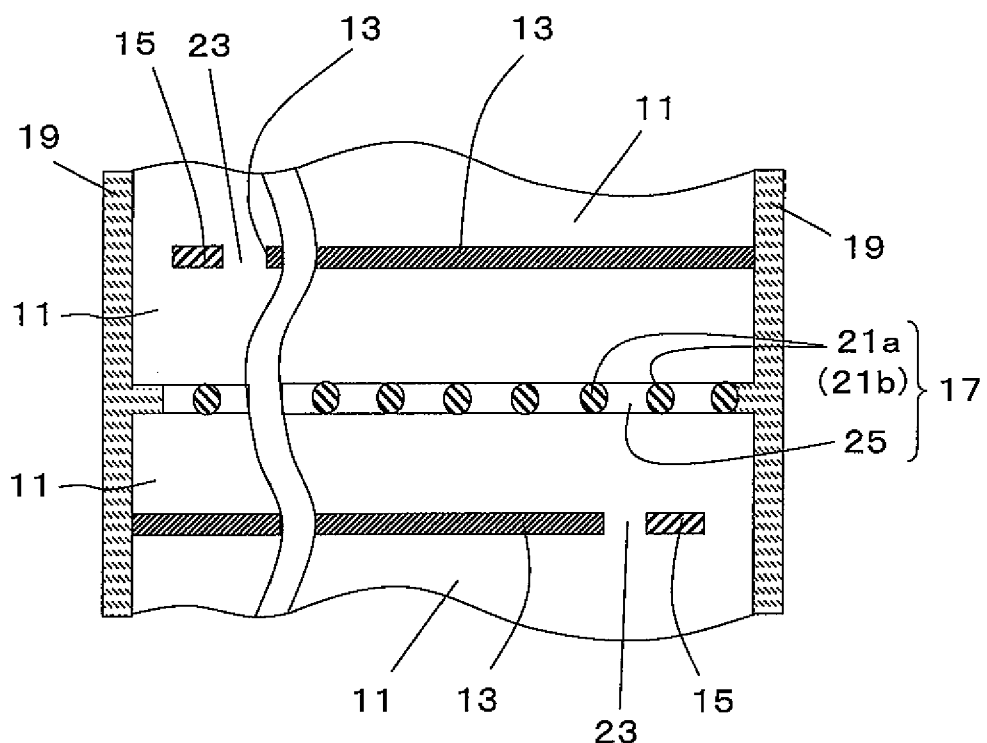
FIG. 10 is other sectional view showing a still other example of the first preferred embodiment (a sectional view when cut by a plane parallel to the laminating direction)
Figure 11:
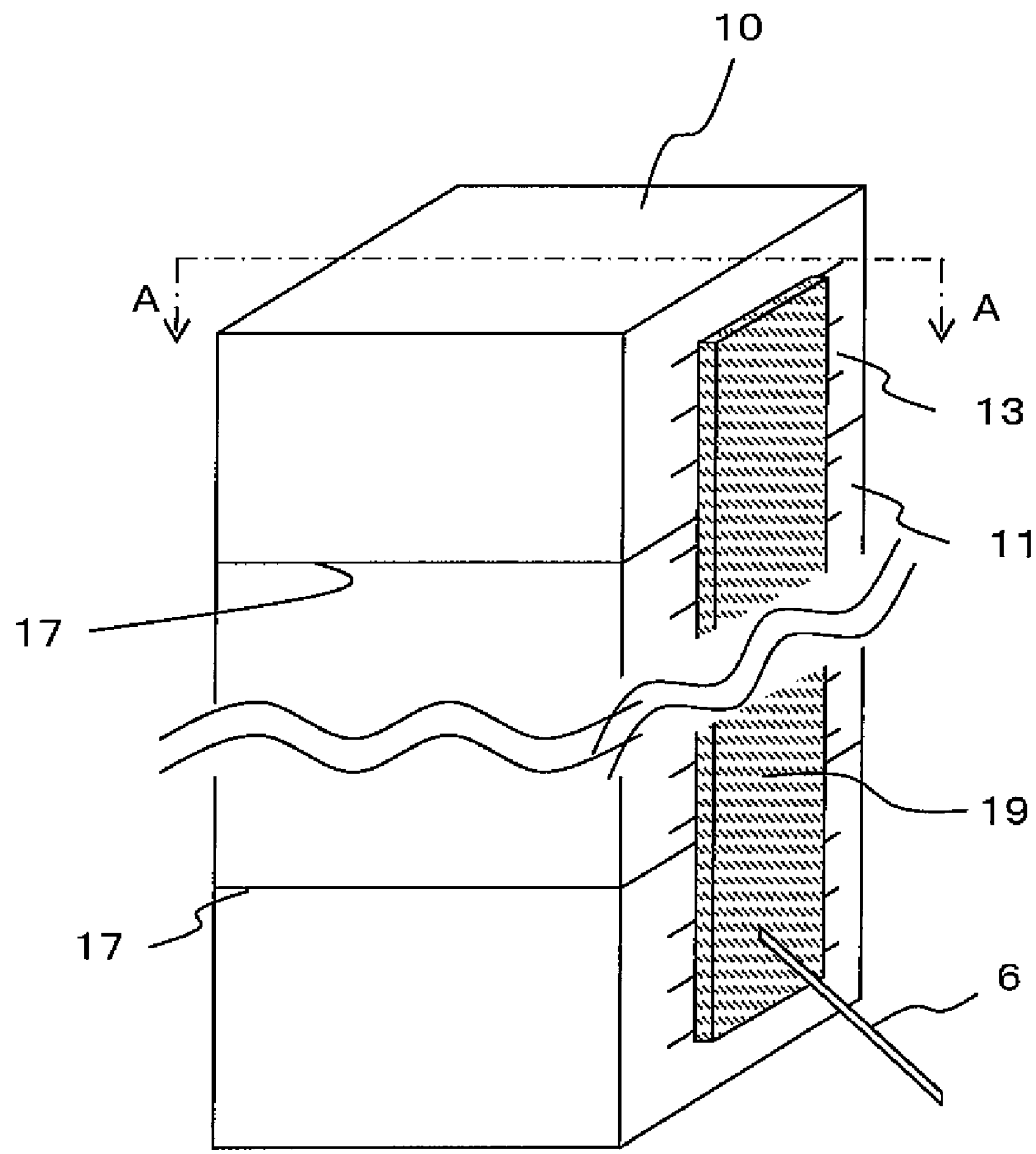
FIG. 11 is a perspective view showing a multilayer piezoelectric element according to a second preferred embodiment of the invention.
Figure 12:
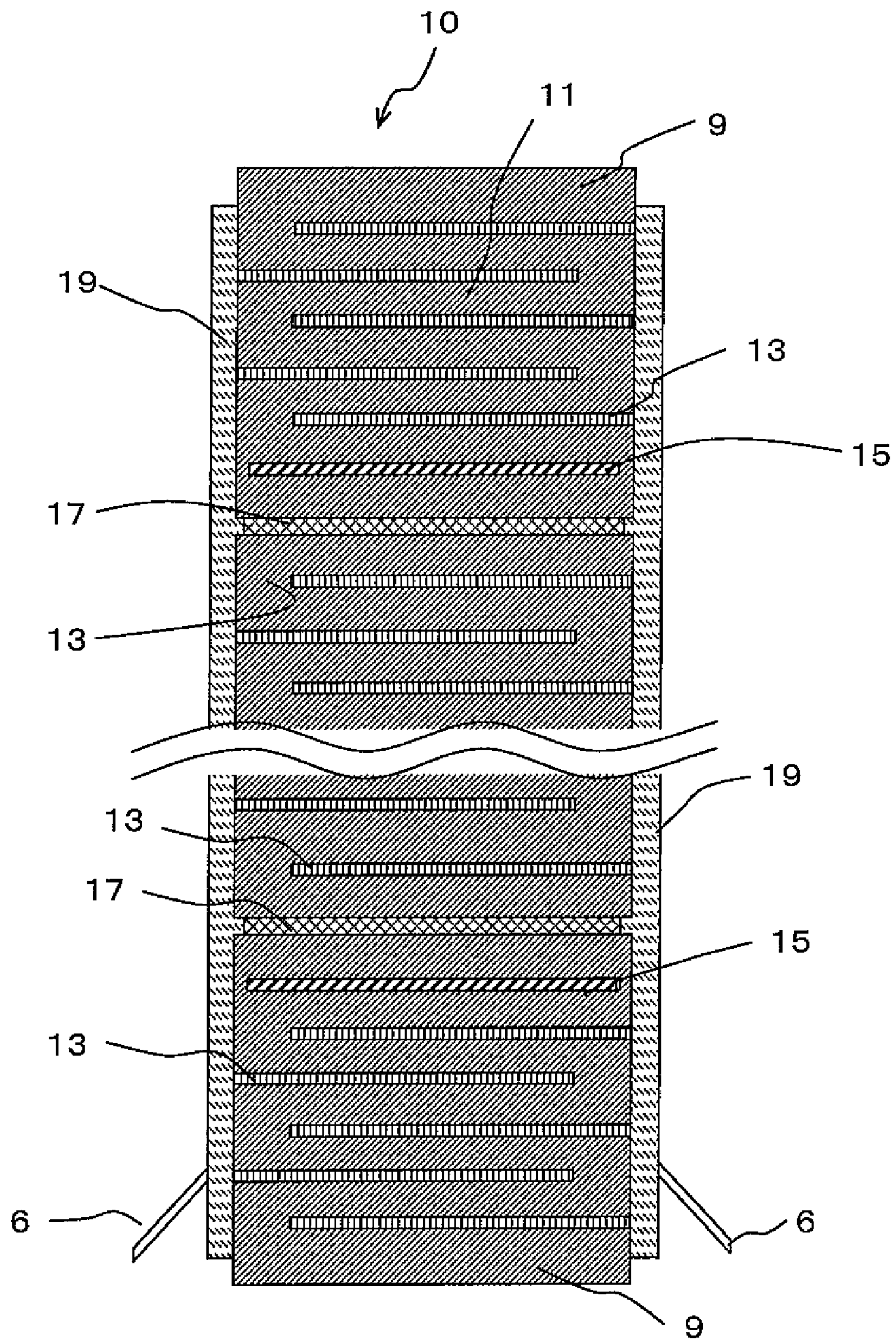
FIG. 12 is a sectional view taken along the line A-A of the multilayer piezoelectric element shown in FIG. 11.
Figure 13:
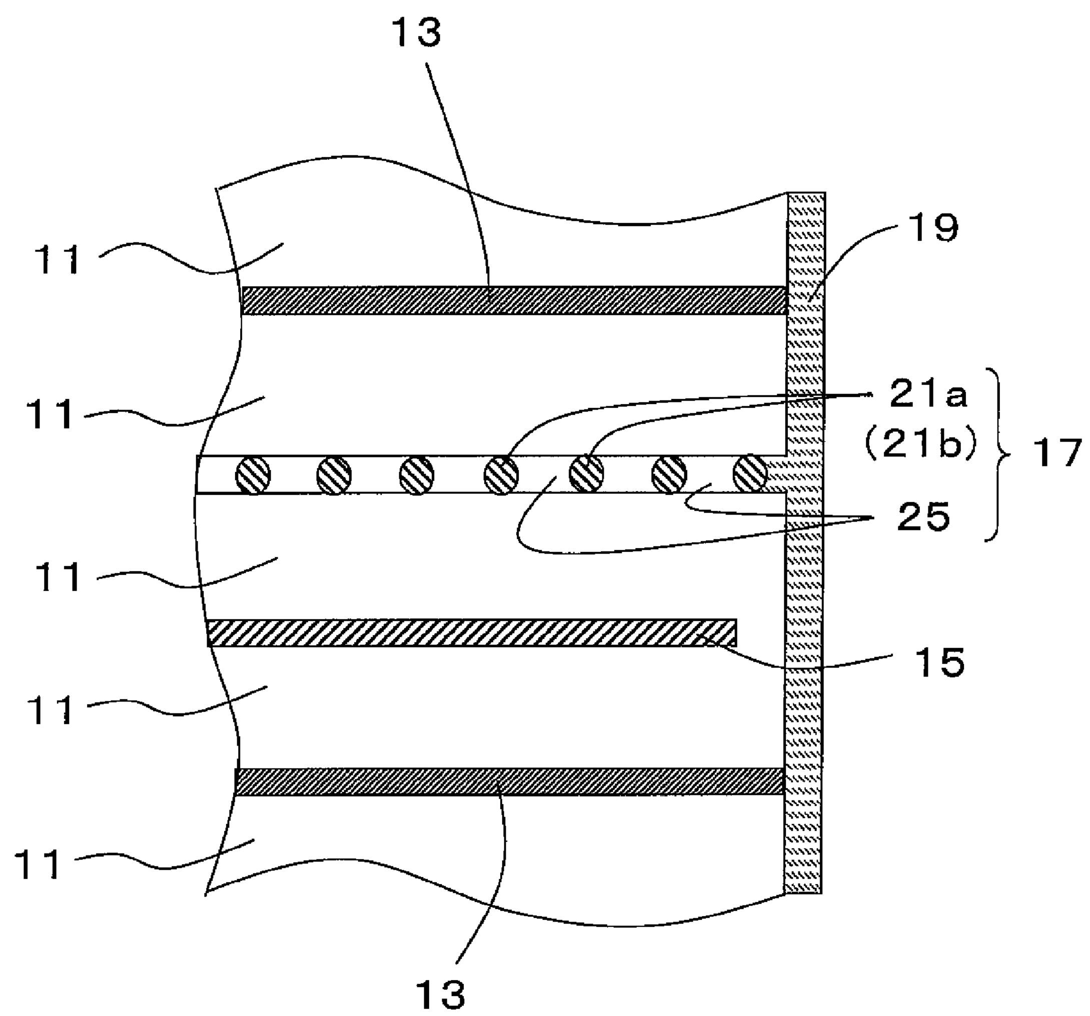
FIG. 13 is a sectional view showing in enlarged dimension a part of the multilayer piezoelectric element shown in FIG. 11.
Figure 14:
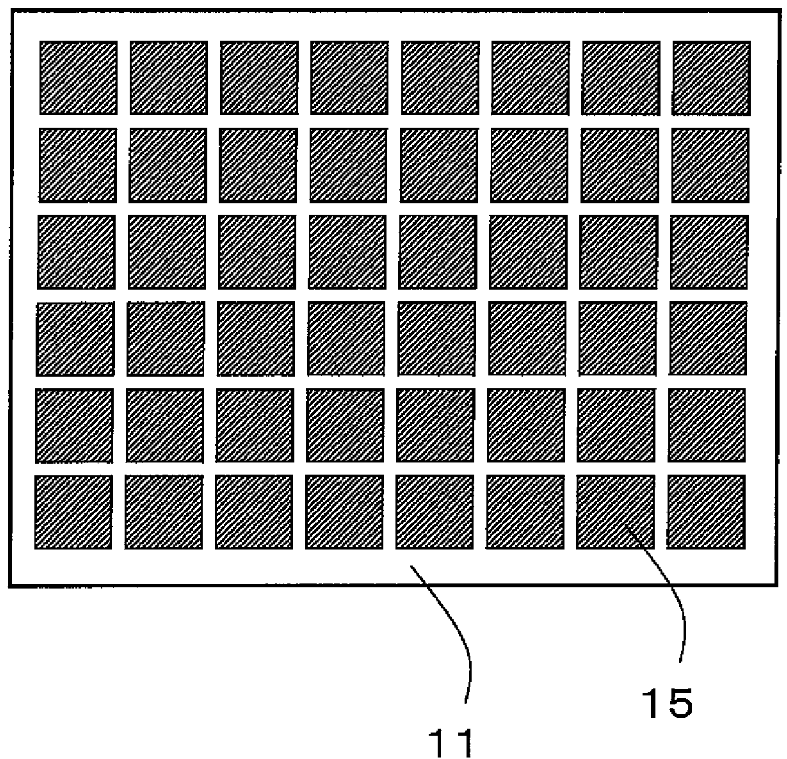
FIG. 14 is a sectional view showing other example of the second preferred embodiment (a sectional view when cut by a plane parallel to the laminating direction)
Figure 15:
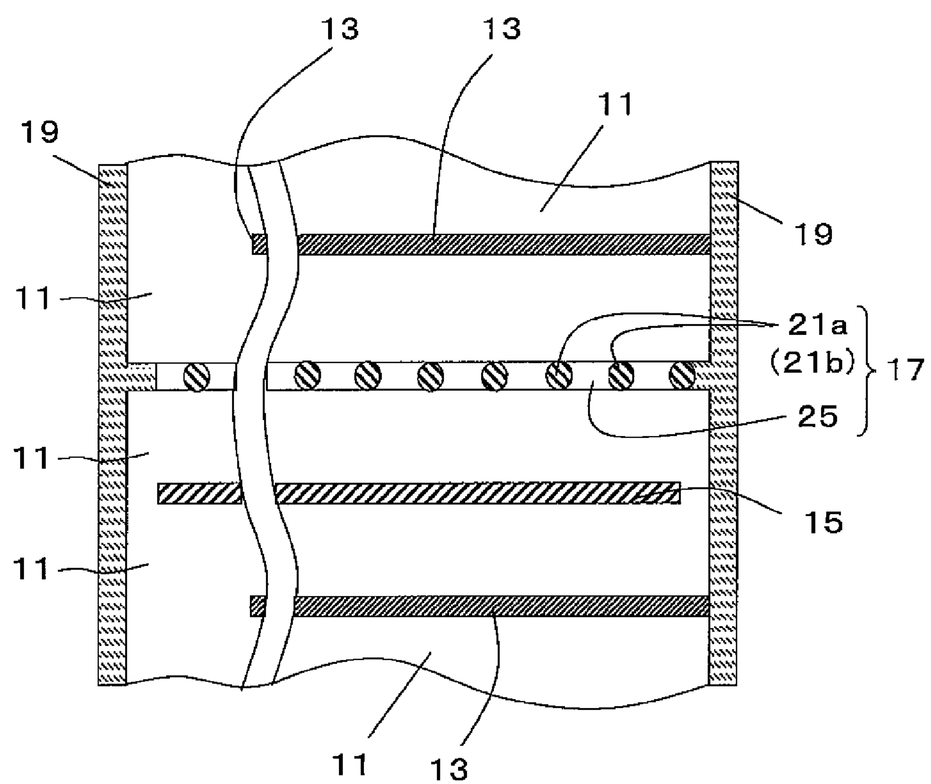
FIG. 15 is a sectional view showing a still other example of the second preferred embodiment (a sectional view when cut by a plane parallel to the laminating direction)
Figure 16:
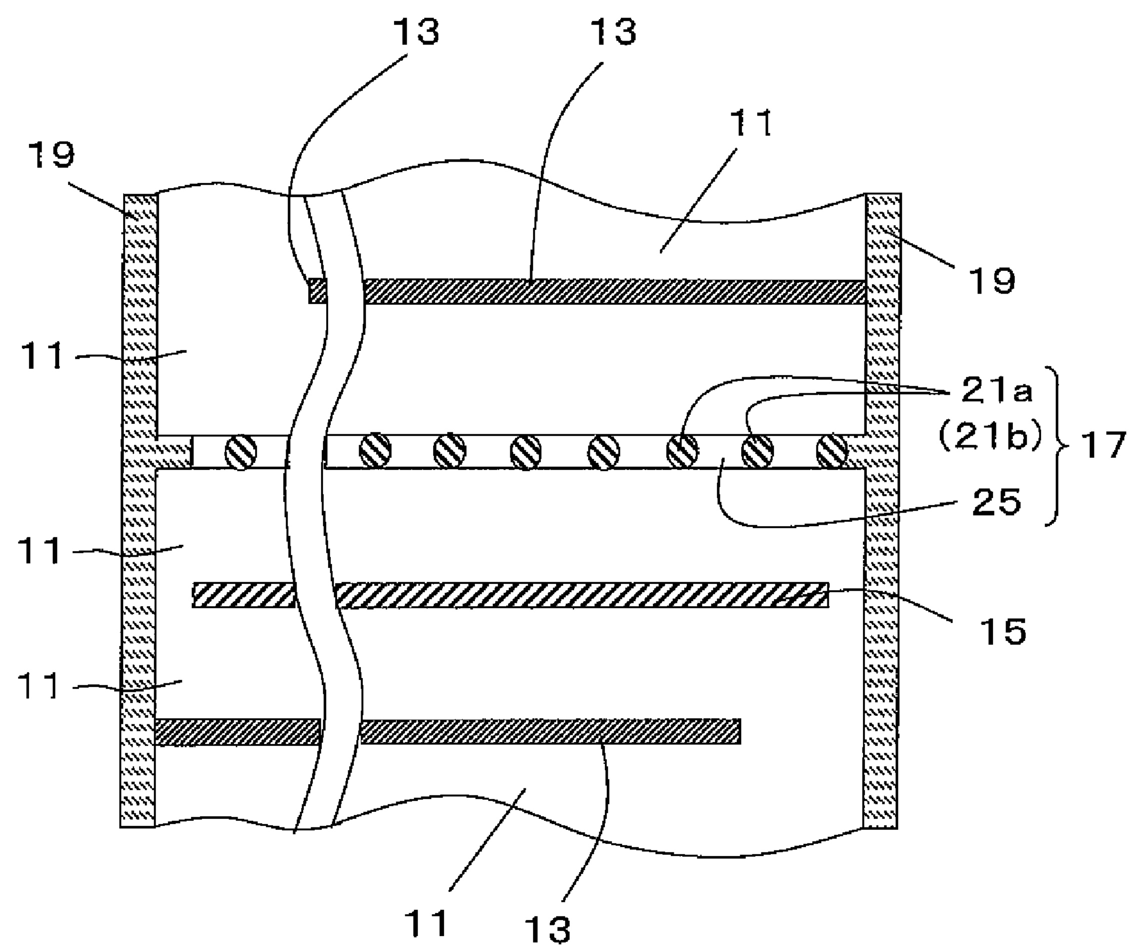
FIG. 16 is another sectional view showing a still other example of the first preferred embodiment (a sectional view when cut by a plane parallel to the laminating direction)
Figure 17:
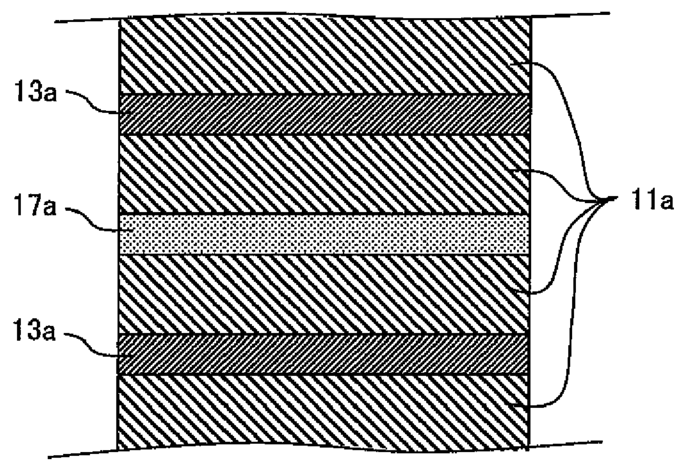
FIGS. 17(*a*) to (*c*) are explanatory drawings showing a method of manufacturing the multilayer piezoelectric element of the invention.
Figure 17:
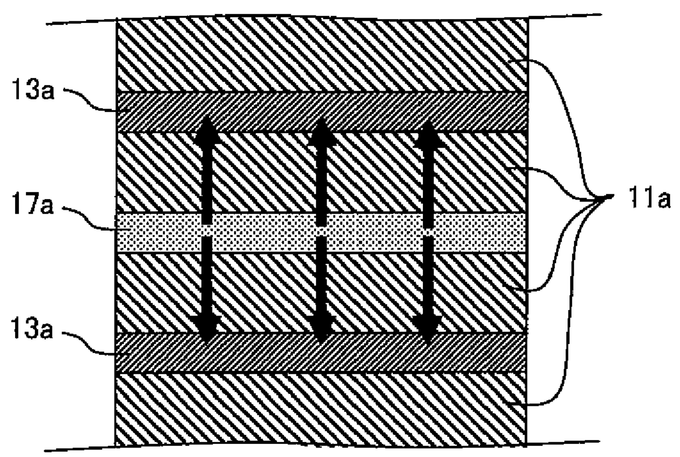
Figure 17:
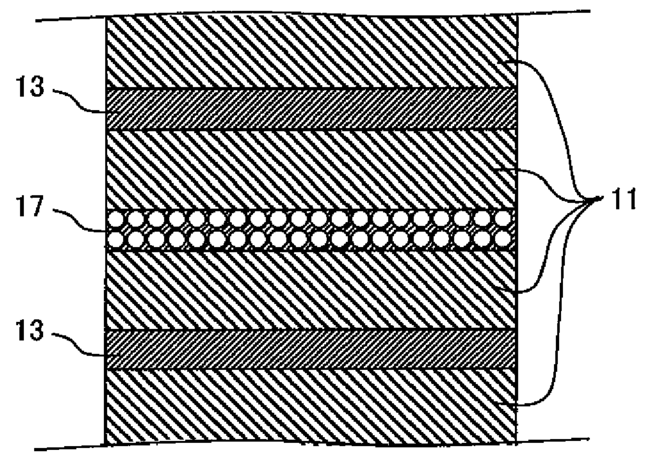
Figure 18:
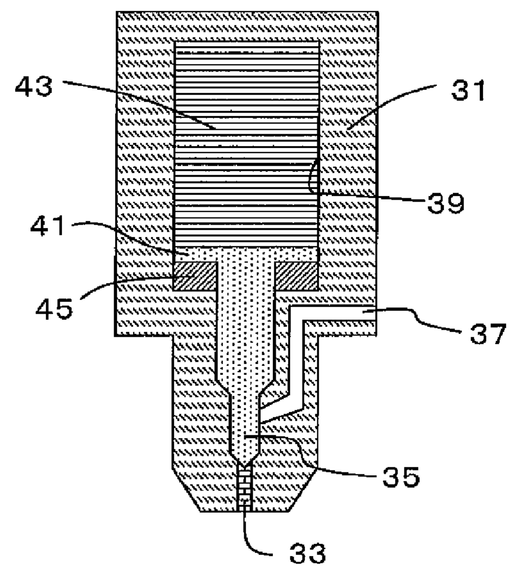
FIG. 18 is a sectional view showing an injection device according to a preferred embodiment of the invention.
Figure 19:
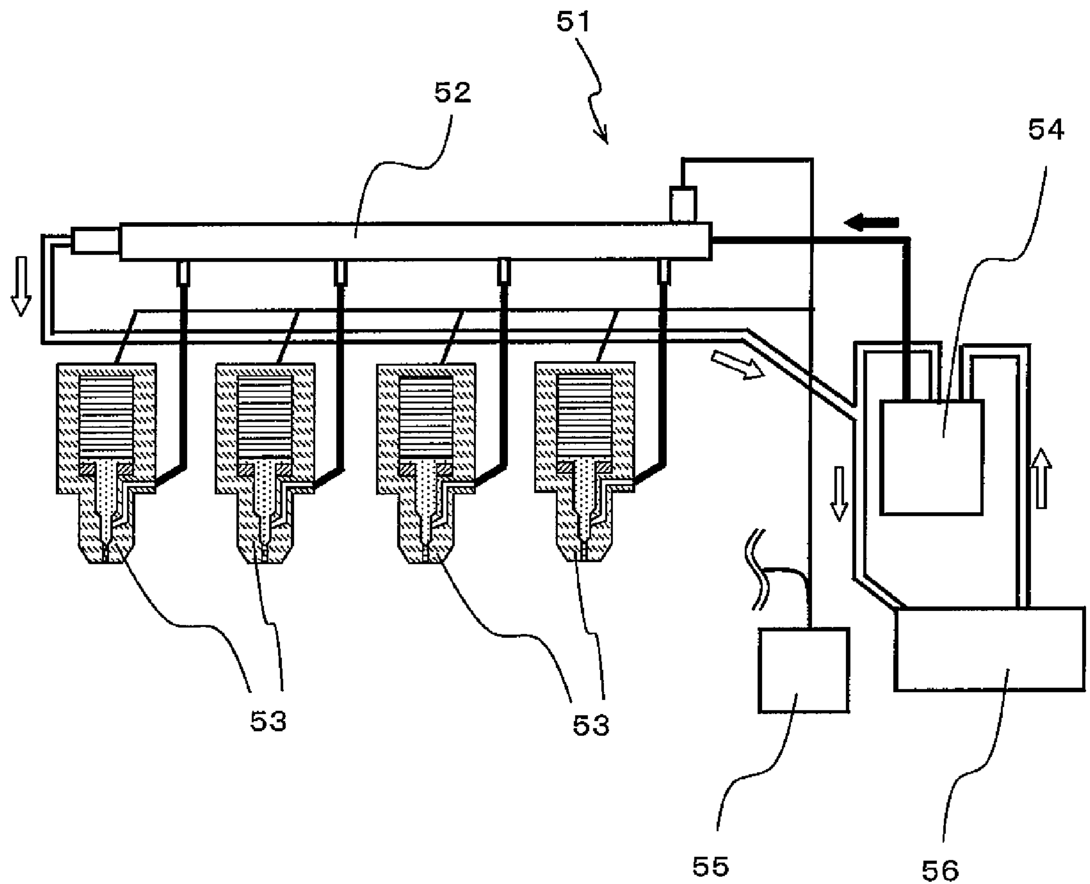
FIG. 19 is a schematic diagram showing a fuel injection common rail system according to a preferred embodiment of the invention.

11 Piezoelectric layer
11*a* Ceramic green sheet
13 Internal electrode
13*a* Internal electrode paste layer
15 Dummy electrode
15*a* Dummy electrode paste layer
17 Porous part
17*a* Stress relaxation paste layer
19 External electrode
21 Metal part
23 Insulating part
25 Void

The invention claimed is:

1. A multilayer piezoelectric element comprising:

a laminated body, wherein the laminated body comprises a plurality of piezoelectric layers laminated with an internal electrode interposed therebetween, a dummy electrode spaced apart and electrically insulated from the internal electrode, an insulating part between the dummy electrode and the internal electrode, wherein the dummy electrode, insulating part, and internal electrode are arranged side by side between the piezoelectric layers adjacent to each other in a laminating direction, and a porous part having more voids than the internal electrode, wherein the porous part is formed at a position opposed in the laminating direction to the insulating part through the piezoelectric layer interposed therebetween, wherein the laminated body has on the side surfaces thereof a pair of external electrodes, and the dummy electrode is electrically connected to an external electrode different from the external electrode, to which the internal electrode existing between the same piezoelectric layers as the dummy electrode, is electrically connected.

2. The multilayer piezoelectric element according to claim 1, wherein the porous part is formed at positions opposed in the laminating direction to the internal electrode, the dummy electrode and the insulating part through the piezoelectric layer interposed therebetween, respectively.

3. The multilayer piezoelectric element according to claim 1, wherein the porous part is formed at positions opposed on both sides in the laminating direction to the insulating part through the piezoelectric layer interposed therebetween, respectively.

4. The multilayer piezoelectric element according to claim 1, wherein the porous part has at least one of metal parts composed of metal and ceramic parts composed of ceramics, existing between two adjacent piezoelectric layers through a void interposed therebetween, respectively.

5. The multilayer piezoelectric element according to claim 1, wherein the internal electrodes, adjacent to each other on both sides in the laminating direction with respect to the porous parts through the piezoelectric layer interposed therebetween, respectively, have the same polarity.

6. The multilayer piezoelectric element according to claim 1, wherein the internal electrodes, adjacent to each other on both sides in the laminating direction with respect to the porous parts through the piezoelectric layer interposed therebetween, respectively, have different polarities.

7. An injection device comprising a container having an injection hole and a multilayer piezoelectric element according to claim 1, wherein liquid filled in the container is delivered from the injection hole by the driving of the multilayer piezoelectric element.

8. A fuel injection system comprising:

a common rail to store high-pressure fuel;

the injection device according to claim 7 to inject the fuel stored in the common rail;

a pressure pump to supply high-pressure fuel to the common rail; and an injection control unit to supply drive signals to the injection device.

9. A method of manufacturing the multilayer piezoelectric element according to claim 1, the method comprising:

forming, on a surface of a ceramic green sheet, an internal electrode paste layer containing a metal composition $M_1$, and forming a dummy electrode paste layer containing a metal composition $M_1$ while leaving a spaced part from the internal electrode paste layer in order to form an insulating part;

forming a stress relaxation paste layer containing a metal composition $M_1$ at a position corresponding to the spaced part on a surface of other ceramic green sheet;

forming a molded laminated body including a portion in which these ceramic green sheets are laminated adjacently; and sintering the molded laminated body, wherein the stress relaxation paste layer has a higher ratio X of the metal composition $M_1$ to the total amount of the metal composition in the paste than the internal electrode paste layer and the dummy electrode paste layer.

10. A multilayer piezoelectric element comprising:

a laminated body, wherein the laminated body comprises a plurality of piezoelectric layers laminated with an internal electrode interposed therebetween, a dummy electrode spaced apart and electrically insulated from the internal electrode, an insulating part between the dummy electrode and the internal electrode, wherein the dummy electrode, insulating part, and internal electrode are arranged side by side between the piezoelectric layers adjacent to each other in a laminating direction, and a porous part having more voids than the internal electrode, wherein the porous part is formed at a position opposed in the laminating direction to the insulating part through the piezoelectric layer interposed therebetween, wherein the laminated body has on the side surfaces thereof a pair of external electrodes, and the dummy electrode is electrically insulated from the external electrodes.

11. The multilayer piezoelectric element according to claim 10, wherein the porous part is formed at positions opposed in the laminating direction to the internal electrode, the dummy electrode and the insulating part through the piezoelectric layer interposed therebetween, respectively.

12. The multilayer piezoelectric element according to claim 10, wherein the porous part is formed at positions opposed on both sides in the laminating direction to the insulating part through the piezoelectric layer interposed therebetween, respectively.

13. The multilayer piezoelectric element according to claim 10, wherein the porous part has at least one of metal parts composed of metal and ceramic parts composed of ceramics, existing between two adjacent piezoelectric layers through a void interposed therebetween, respectively.

14. The multilayer piezoelectric element according to claim 10, wherein the internal electrodes, adjacent to each other on both sides in the laminating direction with respect to the porous parts through the piezoelectric layer interposed therebetween, respectively, have the same polarity.

15. The multilayer piezoelectric element according to claim 10, wherein the internal electrodes, adjacent to each other on both sides in the laminating direction with respect to the porous parts through the piezoelectric layer interposed therebetween, respectively, have different polarities.

16. An injection device comprising a container having an injection hole and a multilayer piezoelectric element according to claim 10, wherein liquid filled in the container is delivered from the injection hole by the driving of the multilayer piezoelectric element.

17. A fuel injection system comprising:

a common rail to store high-pressure fuel;

the injection device according to claim 16 to inject the fuel stored in the common rail;

a pressure pump to supply high-pressure fuel to the common rail; and an injection control unit to supply drive signals to the injection device.

18. A method of manufacturing the multilayer piezoelectric element according to claim 10, the method comprising:

forming, on a surface of a ceramic green sheet, an internal electrode paste layer containing a metal composition $M_1$, and forming a dummy electrode paste layer containing a metal composition $M_1$ while leaving a spaced part from the internal electrode paste layer in order to form an insulating part;

forming a stress relaxation paste layer containing a metal composition $M_1$ at a position corresponding to the spaced part on a surface of other ceramic green sheet;

forming a molded laminated body including a portion in which these ceramic green sheets are laminated adjacently; and sintering the molded laminated body, wherein the stress relaxation paste layer has a higher ratio X of the metal composition $M_1$ to the total amount of the metal composition in the paste than the internal electrode paste layer and the dummy electrode paste layer.

19. A multilayer piezoelectric element comprising: a laminated body, wherein the laminated body comprises a plurality of piezoelectric layers laminated with an internal electrode interposed therebetween, wherein the laminated body has, between internal electrodes adjacent to each other in the laminating direction of the laminated body, a porous part having more voids than the internal electrodes, and has, between the porous part and at least one of the internal electrodes adjacent to each other, a dummy electrode spaced apart and electrically insulated from the internal electrodes, and wherein the laminated body has on the side surfaces thereof a pair of external electrodes, and the dummy electrode is electrically insulated from the external electrodes.

20. The multilayer piezoelectric element according to claim 19, wherein the porous part has at least one of metal parts composed of metal and ceramic parts composed of ceramics, existing between two adjacent piezoelectric layers through a void interposed therebetween, respectively.

* * * * *